(12) United States Patent
McKinnell et al.

(10) Patent No.: US 7,205,675 B2
(45) Date of Patent: Apr. 17, 2007

(54) MICRO-FABRICATED DEVICE WITH THERMOELECTRIC DEVICE AND METHOD OF MAKING

(75) Inventors: James C. McKinnell, Salem, OR (US); John Liebeskind, Corvallis, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 38 days.

(21) Appl. No.: 10/353,632

(22) Filed: Jan. 29, 2003

(65) Prior Publication Data

US 2004/0145049 A1 Jul. 29, 2004

(51) Int. Cl.
*H01L 23/38* (2006.01)
*H01L 27/16* (2006.01)
*F25B 21/02* (2006.01)

(52) U.S. Cl. ......................................... 257/930; 62/3.2
(58) Field of Classification Search ................ 257/930; 62/3.2
See application file for complete search history.

(56) References Cited

U.S. PATENT DOCUMENTS

| | | | | |
|---|---|---|---|---|
| 5,032,897 A | * | 7/1991 | Mansuria et al. ............ 257/701 |
| 5,385,020 A | * | 1/1995 | Gwilliam et al. ............. 62/3.7 |
| 5,448,109 A | | 9/1995 | Cauchy | |
| 5,515,238 A | | 5/1996 | Fritz et al. | |
| 5,550,387 A | * | 8/1996 | Elsner et al. ................. 257/15 |
| 5,714,791 A | | 2/1998 | Chi et al. | |
| 5,863,708 A | * | 1/1999 | Zanzucchi et al. .......... 430/320 |
| 5,896,210 A | * | 4/1999 | Redfield et al. ............... 359/30 |
| 5,918,469 A | * | 7/1999 | Cardella ....................... 62/3.7 |
| 5,950,067 A | * | 9/1999 | Maegawa et al. ............. 438/22 |
| 6,222,113 B1 | | 4/2001 | Ghoshal | |
| 6,282,907 B1 | | 9/2001 | Ghoshal | |
| 6,376,984 B1 | * | 4/2002 | Fernandez et al. ........... 313/530 |

FOREIGN PATENT DOCUMENTS

| | | | |
|---|---|---|---|
| EP | 1120642 A2 | | 8/2001 |
| JP | 1-124724 | * | 6/1989 |
| JP | 3-236288 | | 10/1991 |
| JP | 11-233837 | | 8/1999 |
| JP | 2000-311974 | | 11/2000 |
| JP | 2000-340848 | | 12/2000 |

* cited by examiner

*Primary Examiner*—Douglas W. Owens
*Assistant Examiner*—Samuel A Gebremariam (57) ABSTRACT

A micro-fabricated device, includes a support structure having an aperture formed therein, and a device substrate disposed within the aperture. The micro-fabricated device further includes a thermally isolating structure thermally coupling the device substrate to the support structure. The thermally isolating structure includes at least one n-doped region and at least one p-doped region formed on or in the thermally isolating structure and separated from each other. In addition, the thermally isolating structure includes an electrical interconnect connecting at least one n-doped region and at least one p-doped region, forming an integrated thermoelectric device.

29 Claims, 8 Drawing Sheets

MICRO-FABRICATED DEVICE WITH THERMOELECTRIC DEVICE AND METHOD OF MAKING

BACKGROUND

Description of the Art

Over the past decade, the demand for cheaper and higher performance electronic devices has led to a growing need to manufacture electronic devices having lower power consumption as well as improved thermal efficiency. Microprocessors are a good example of the ever-increasing demands on power consumption and thus the need to better handle power dissipation. To a large extent these advances have been made possible by increases in packaging density which has led to a significant rise in power dissipation that in turn leads to a substantial increase in chip heat flux. Today's high performance computing devices, if left unaltered will result in peak temperatures that will destroy or damage the silicon-based devices on which microprocessors are typically formed.

Demand for improved thermal efficiency is also increasing in the emerging area of Micro-Electro-Mechanical Systems (MEMS), which are being developed as smaller alternative systems to conventional electromechanical devices such as relays, actuators, sensors, and valves and other transducers. In addition, such electromechanical devices incorporated in a MEMS device can be further integrated with integrated circuits providing improved performance over conventional systems. Many types of transducers, incorporated into MEMS devices, such as, vacuum sensors, gas flow sensors, infrared detectors, and AC power converters operate in the detection of, or utilization of, a temperature difference that is isolated from the rest of the integrated circuit (IC).

One methodology utilized in electronics to dissipate heat in a semiconductor device is to provide good thermal conduction between the packaged semiconductor device and the surrounding outside environment. In many cases, a heat sink attached to the package, which is adapted to dissipate heat by relying on convection cooling with air flowing over the heat sink provided by a fan, is utilized. However, in other cases good thermal conduction is limited by the opposing need for electrical isolation. That is, in many cases, typically, these two requirements are mutually exclusive because those materials that are good thermal conductors are, also, typically good electrical conductors as well.

In highly integrated systems, such as MEMS devices, different portions of the same device may operate more efficiently at temperatures significantly above or below ambient conditions. For example, a vacuum sensor may operate at its maximum efficiency at over a 100° C. while associated CMOS circuitry processing the output of the vacuum sensor or controlling some other function may more efficiently operate at room temperature or even sub-ambient temperatures such as −25° C. Generally, solutions to such problems results in tradeoffs by utilizing moderate thermal conduction over the device, increasing the power applied to the vacuum sensor to heat it, while also trying to maintain the CMOS circuitry at a lower temperature, typically room temperature. The end result is an electronic device whose performance is compromised. The inability to control thermal losses can both, result in a significant increase in power consumption as well as less than optimum performance. In addition, sub-ambient cooling of electronic devices, such as, for example, high-end mainframe computer systems, typically, utilize refrigeration based systems which significantly add to the complexity and cost.

If these problems persist, the continued growth and advancements in the use electronic devices, especially MEMS devices, in various electronic products, seen over the past several decades, will be reduced. In areas like consumer electronics, the demand for cheaper, smaller, more reliable, higher performance electronics constantly puts pressure on improving and optimizing performance of ever more complex integrated devices. The ability, to optimize thermal performance will open up a wide variety of applications that are currently either impractical or not cost effective.

DESCRIPTION OF THE PREFERRED EMBODIMENTS

Figure 1A:
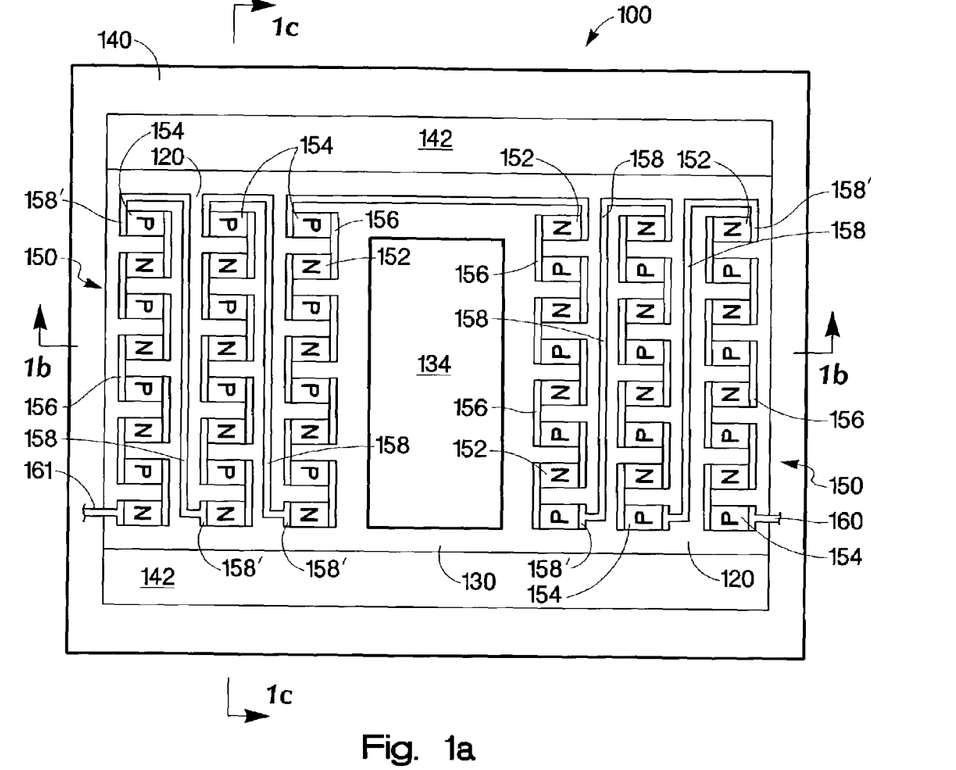
FIG. 1a is a top view of a micro-fabricated device according to an embodiment of the present invention.

Referring to FIG. 1a, a top view is shown of an embodiment of micro-fabricated device 100 of the present invention. In this embodiment, thermally isolating structure 120 includes thermoelectric device 150 that provides selective heating or cooling of device substrate 130. In addition, thermally isolating structure 120 reduces the thermal conductivity between device substrate 130 and support structure 140 while also providing mechanical support. Device substrate 130 is disposed, within aperture 142 formed in support structure 140.

In this embodiment, active device 134 is disposed on device substrate 130. Active device 134 includes, for example, various transistors (including thin-film-transistor (TFT) technology using polysilicon on glass substrates), diodes, logic cells, as well as sensors, transducers, electron emitters, bolometers, and superconductoring high Q RF filters to name just a few of the many active devices that may be utilized in the present invention either separately or in combination. To simplify the drawing active device 134 is represented as only a single layer in FIGS. 1a–1c although it is readily apparent that such devices typically may be realized as a stack of thin film layers.

It should be noted that the drawings are not true to scale. Further, various elements have not been drawn to scale. Certain dimensions have been exaggerated in relation to other dimensions in order to provide a clearer illustration and understanding of the present invention.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by various embodiments, it is not intended that these illustrations be a limitation on the scope or applicability of the present invention. Further it is not intended that the embodiments of the present invention be limited to the physical structures illustrated. These structures are included to demonstrate the utility and application of the present invention to presently preferred embodiments.

Thermoelectric device 150 is formed utilizing a plurality of n-doped regions 152 and p-doped regions 154 formed in thermally isolating structure 120. N-doped regions 152 and p-doped regions 154 are formed by selectively implanting the desired dopant in the desired area as shown in cross-sectional view in FIGS. 1b and 1c. In this embodiment, the n-doped and p-doped regions are square in shape; however, in alternate embodiments, other shapes such as a rectangle may also be utilized. The particular shape utilized will depend on, for example, the desired heating or cooling characteristics of thermoelectric device 150, the shape of thermally isolating structure 120, and the particular material used to form thermally isolating structure 120. In addition, both the dopant level and depth may also be varied. The doped regions are formed utilizing conventional photolithographic and implanting equipment, such as ion beam implantation through a dielectric layer opening, or a mask layer generated photo lithographically. The doped regions are arranged and electrically coupled to each other in such a manner that the electronic carriers, i.e. holes and electrons in p-doped regions 154 and n-doped regions 152 respectively, work cooperatively to heat or cool device substrate 130.

Figure 1B:
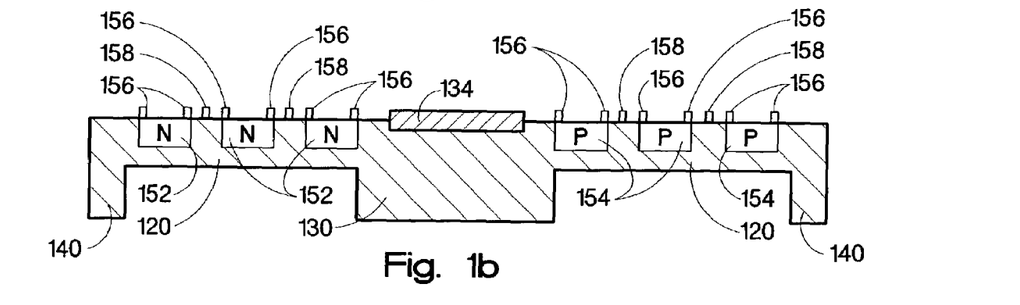
FIG. 1b is a cross-sectional view of the micro-fabricated device shown in FIG. 1a according to an embodiment of the present invention.
Figure 1C:
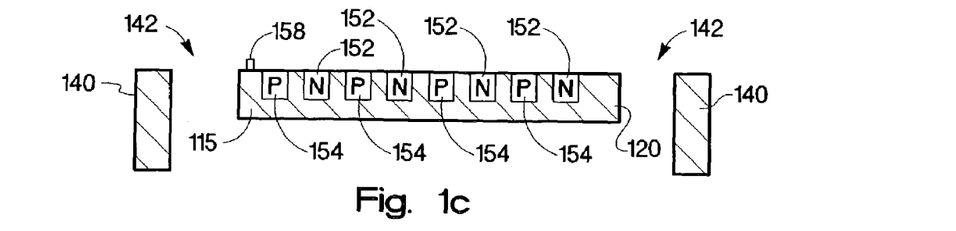
FIG. 1c is a cross-sectional view of the micro-fabricated device shown in FIG. 1a according to an embodiment of the present invention.

The n-doped and p-doped regions are electrically connected by coupling conductors 156, and end portion 158' of segment conductors 158, over n-doped and p-doped regions 152 and 154, generating an alternating series as shown, in cross-sectional view, in FIG. 1c. Coupling conductors 156, and segment conductors 158, are thin films deposited, for example, by sputter deposition through the desired pattern openings generated utilizing photolithographic processes and associated etch processes. In this embodiment, coupling conductors 156 and segment conductors 158 are aluminum conductors, however, in alternate embodiments, any electrical conductor having the desired current carrying capacity may also be utilized, such as for example, gold, tungsten, copper, and platinum to name a few. During operation current is applied to thermoelectric device 150 through either power conductor 160 or 161. For example, current applied to power conductor 161 connected to an n-doped region and returned through power conductor 160 connected to a p-doped region causes the majority carriers to travel in the same direction so that thermal energy (i.e. the majority carriers are also the majority thermal carriers) is transferred from device substrate 130 to support structure 140 through thermally isolating structure 120 thereby cooling device substrate 130. If the current is reversed then the direction of travel of the majority carriers is reversed and the direction of thermal transfer is also reversed so that thermal energy is transferred from support 140 to device substrate 130 thereby heating device substrate 130.

Figure 1D:
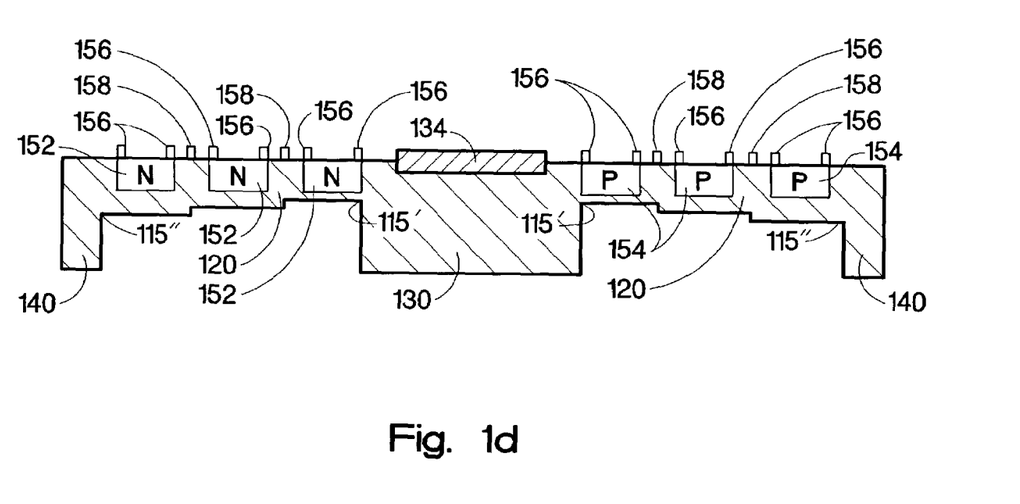
FIG. 1d is a cross-sectional view of the micro-fabricated device shown in FIG. 1a according to an alternate embodiment of the present invention.

Device substrate 130, thermally isolating structures 120, and support structure 142 form a substantially planar structure as shown in cross-sectional views in FIGS. 1b and 1c. In this embodiment, device substrate 130, support structure 140 and thermally isolating structures 120 are formed from an intrinsic silicon wafer. In alternate embodiments, silicon on insulator, lightly doped semiconductor wafers, epitaxial silicon grown over an oxide may also be utilized. In still other embodiments, micro-fabricated device 100 may be formed utilizing wafers or substrates made from materials such as glass, sapphire, ceramic, gallium arsenide, germanium, indium phosphide, and various polymers to name just a few. The particular material utilized for micro-fabricated device 100 will depend on various parameters, such as, the particular application in which the device will be utilized, both process and operating temperatures, the presence or absence of active electronic devices, and the thermal and mechanical properties of the device. In addition, cross-sectional area 115 of thermally isolating structures 120 may vary to further tune the thermal conduction of isolating structures 120 by varying the thickness of thermally isolating structure 120. For example, cross-sectional area 115 of thermally isolating structures 120 has a uniform thickness as shown in FIGS. 1a–1c. In alternate embodiments, the cross-sectional area may vary over the length of thermally isolating structure 120 as shown in FIG. 1d, where cross-sectional area 115' near device substrate 130 is less than the cross-sectional area 115" near substrate 140.

Figure 2:
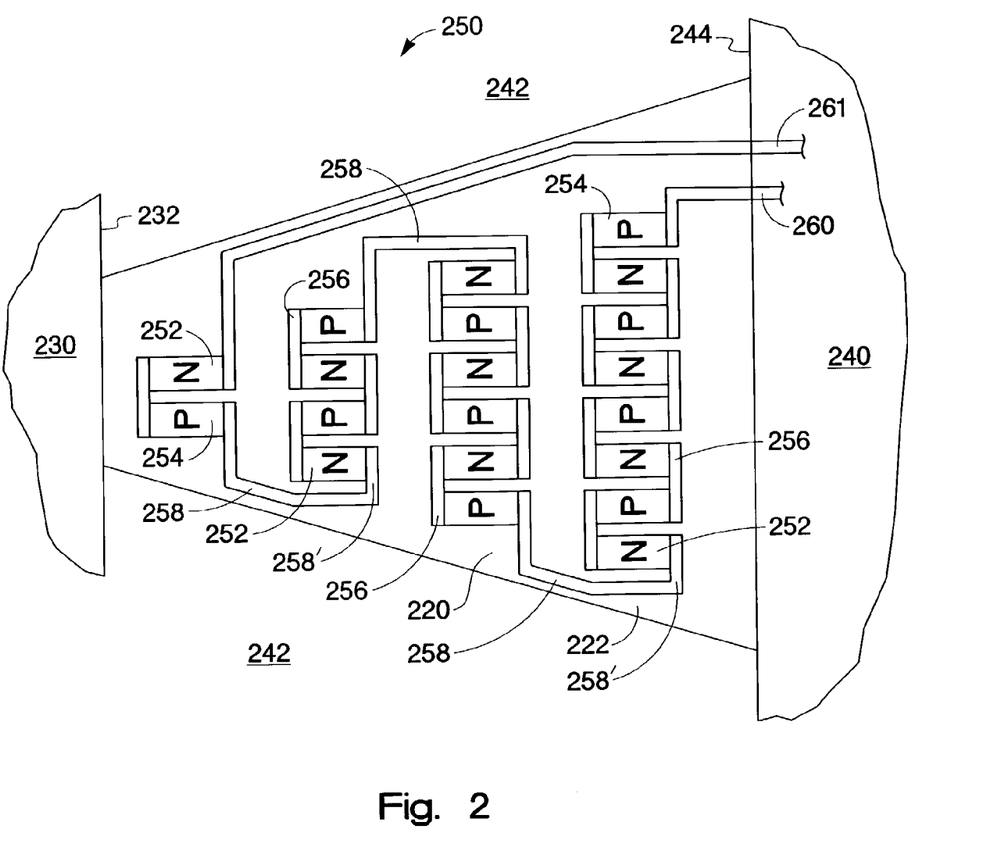
FIG. 2 is a top view of a micro-fabricated device according to an alternate embodiment of the present invention.

Referring to FIG. 2, an alternate embodiment of thermoelectric device 250 is shown in a top view. Thermally isolating structure 220 has a trapezoidal shape providing thermoelectric device 250 with an increasing number of pn pairs or thermoelectric segments. The particular number of pn pairs or thermoelectric segments will depend on the particular application in which the micro-fabricated device will be utilized. In this embodiment, thermally isolating structure 220 has one pair at peripheral edge 232 of device substrate 230, and increasing to four pairs at inner edge 244 of support structure 240. Such a structure reduces the thermal conduction out of device substrate 230 and increases the thermal energy transferred to support structure 240 by the increasing number of thermoelectric elements. Although only one thermally isolating structure 220 is shown for illustrative purposes, in this embodiment, multiple structures may be utilized to optimize the thermal energy transfer between device substrate 230 and support structure 240. For example, four isolating structures each having a thermoelectric device, one isolating structure attached to each peripheral side of a device substrate having four sides may be utilized, or multiple isolating structures attached to each peripheral side (e.g. 2, 3, 4 or more) may also be utilized. Another example, suitable for a circular shaped device substrate would have multiple structures emanating in a radial direction from the peripheral edge of the device substrate. In addition, device substrate 230 may also utilize various active devices (not shown) as described earlier.

Figure 3A:
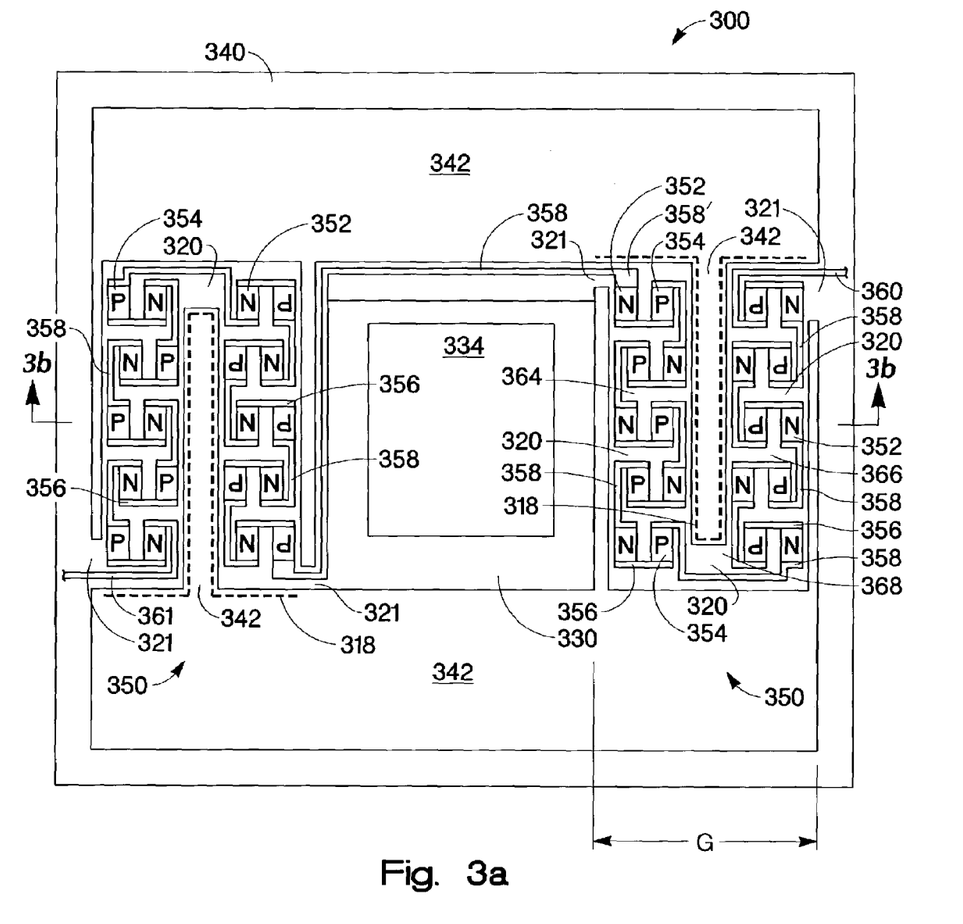
FIG. 3a is a top view of a micro-fabricated device according to an alternate embodiment of the present invention.
Figure 3B:
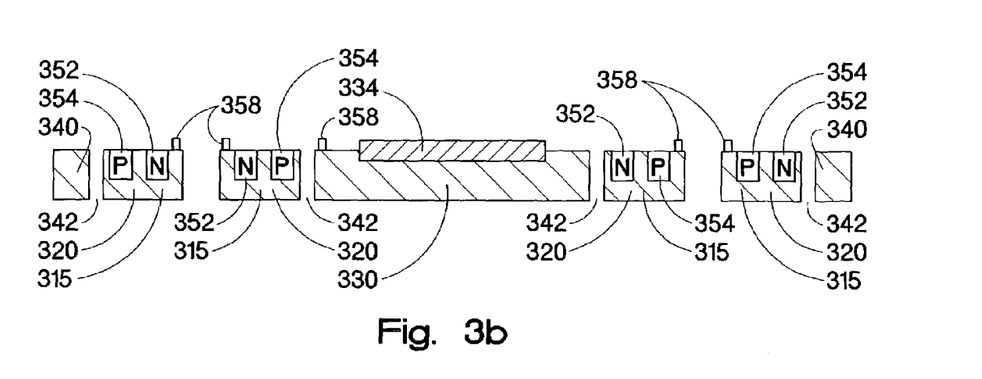
FIG. 3b is a cross-sectional view of the micro-fabricated device shown in FIG. 3a according to an alternate embodiment of the present invention.

Referring to FIG. 3a, an alternate embodiment of micro-fabricated device 300 of the present invention is shown in a top view. In this embodiment, thermally isolating structure 320 includes, thermoelectric devices 350, and reduces the thermal conduction between device substrate 330 and support structure 340. Thermally isolating structure 320 has characteristic length or thermal conduction path 318 measured between points 321, where path 318 is greater than distance G the gap between support structure 340 and device substrate 330 formed by aperture 342. The longer thermal conduction path of thermally isolating structure 320 reduces the thermal conduction between device substrate 330 and support structure 340 compared to a straight structure having length G and a similar cross-sectional area as thermally isolating structure 320. In this embodiment, thermally isolating structure 320 includes a folded structure having at least one fold. Thermally isolating structure 320 includes first section 364, second section 366 and folding section 368. First section 364 and second section 366 are substantially parallel to each other with the three sections 364, 366, and 368 forming a U shaped structure. In addition thermally isolating structure 320 also provides mechanical support of device substrate 330. Device substrate 330 is disposed, within aperture 342 formed in support structure 340.

Thermoelectric device 350 is formed utilizing a plurality of n-doped regions 352 and p-doped regions 354 formed in thermally isolating structure 320. In this embodiment, the n-doped and p-doped regions are slightly offset to provide space for segment conductor 358. However, in an alternate embodiment, segment conductors may also be routed over a doped region to further reduce the width, and thus cross-sectional area 315, of thermally isolating structure 320. A dielectric layer such as silicon oxide or nitride or polymer dielectric is, in this case, interposed between the doped region and segment conductor 358 to provide electrical isolation. In this embodiment, coupling conductors 356 and segment conductors 358 may be any electrical conductor having the desired current carrying capacity as described earlier. Current is applied to either power conductor 360 or 361 depending on whether substrate 330 is heated or cooled. In addition, cross-sectional area 315 of thermally isolating structures 320 may vary to further tune the thermal conduction of isolating structures 320 by varying the thickness of thermally isolating structure 320.

Figure 4A:
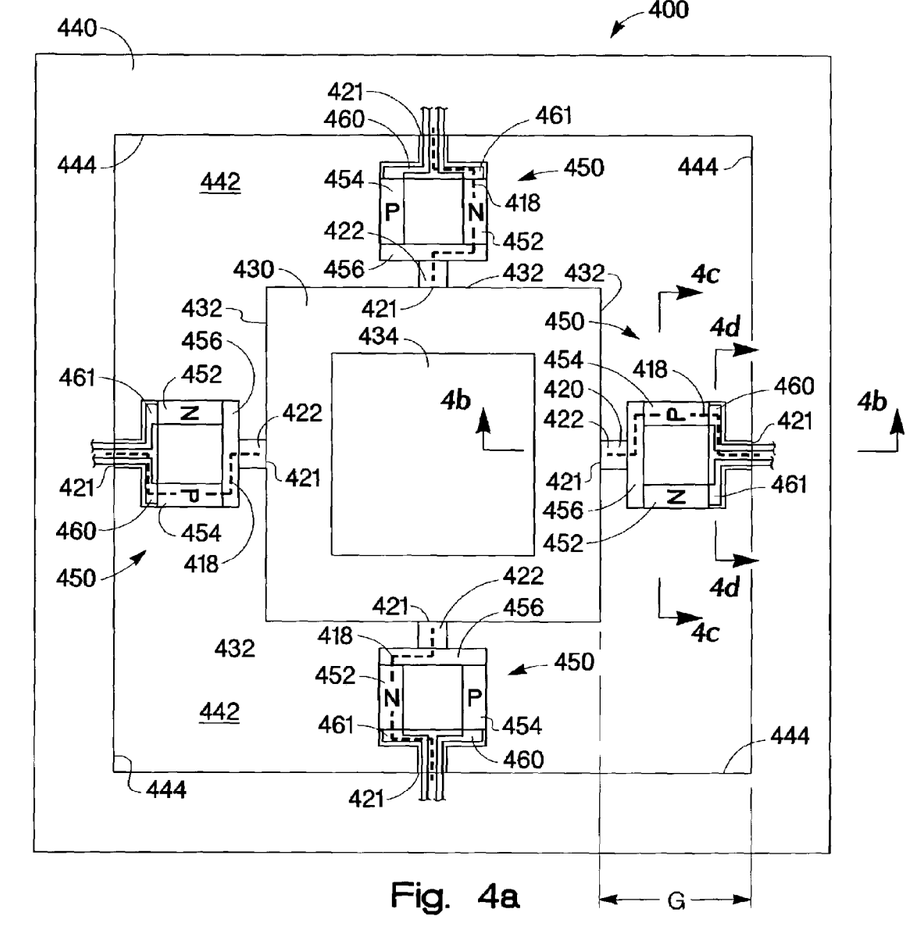
FIG. 4a is a top view of a micro-fabricated device according to an alternate embodiment of the present invention.

Referring to FIG. 4a, a top view of micro-fabricated device 400, an alternate embodiment of the present invention, is shown. In this embodiment, peltier or thermoelectric device 450 includes segments formed on both first major or top surface 422 and second major or bottom surface 424 (see FIGS. 4b–4d) of thermally isolating structure 420 that is attached to peripheral edge 432 of device substrate 430 and inner edge 444 of support structure 440. In addition, thermally isolating structure 420 has characteristic length 418 measured between points 421, where characteristic length or thermal conduction path 418 is greater than distance G the gap between support structure 440 and device substrate 430 formed by aperture 442. In this embodiment, characteristic length 418 is representative of the thermal path, that thermal energy travels between device substrate 430 and support structure 440.

Device substrate 430 is disposed, within aperture 442 formed in support structure 440. Active device 434 is disposed on device substrate 430. Active device 434 includes any of the various active devices described in previous embodiments. In this embodiment, device substrate 430, thermally isolating structure 420, and support structure may be formed from any material on which active device 434 may be formed.

Figure 4B:
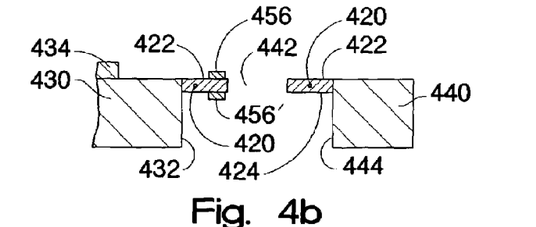
FIG. 4b is a cross-sectional view of the micro-fabricated device shown in FIG. 4a according to an alternate embodiment of the present invention.
Figure 4C:
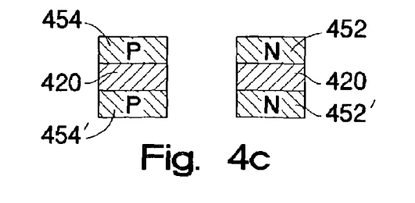
FIG. 4c is a cross-sectional view of the micro-fabricated device shown in FIG. 4a according to an alternate embodiment of the present invention.
Figure 4D:
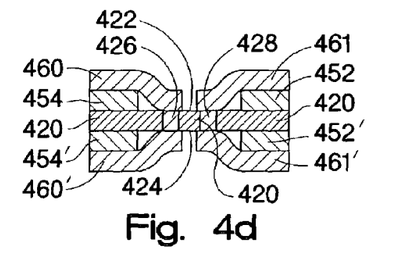
FIG. 4d is a cross-sectional view of the micro-fabricated device shown in FIG. 4a according to an alternate embodiment of the present invention.

Peltier device 450 includes n-doped region 452 and p-doped region 454 formed on major surface 422 and n-doped region 452' and p-doped region 454' on second major surface 424 as shown, in a cross-sectional view, in FIGS. 4c–4d. In this embodiment, device substrate 430 and thermally isolating structure 420 utilize an electrically insulating substrate such as a glass or polymer substrate. The n and p doped regions may be formed by deposition of a high Seebeck coefficient material such as SbTe, BiTe, PbTe, and various skutterdites including ternary skutterdites, to name just a few examples, on thermally isolating structure 420. The high Seebeck coefficient material may be deposited by sputter deposition, plasma enhanced chemical vapor deposition, evaporation, or other appropriate deposition process. For those embodiments utilizing a semiconductor wafer to form device substrate 430 and thermally isolating structure 420 the n and p doped regions may be formed either by deposition of the high Seebeck coefficient material or by ion implantation as described above in previous embodiments or some combination thereof, utilizing the appropriate electrical interconnect and isolation scheme. In this embodiment, each leg of thermally isolating structure 420 forms either an n-doped or p-doped region, however, in alternate embodiments multiple n and p-doped regions may also be utilized. Coupling conductors 456 and 456' electrically couple n-doped regions to p-doped regions as shown in FIGS. 4a and 4b. Power conductors 460, and 461, through which current is applied to peltier device 450, are electrically coupled to one end of the p and n doped regions. In this embodiment, current is applied to both segments via power conductors 460 and 461 as shown in FIG. 4a. Via conductor 426 provides an electrical path between power conductor 460 and 460' and via conductor 428 provides an electrical path between conductor 461 and 461' as shown in cross-sectional view in FIG. 4d, thereby providing electrical power to the bottom or lower segment. In alternate embodiments, current may be applied to power conductors 460' and 461' separately by, for example, utilizing electrical traces formed and routed on the bottom or underside surface of support structure 440.

Figure 5:
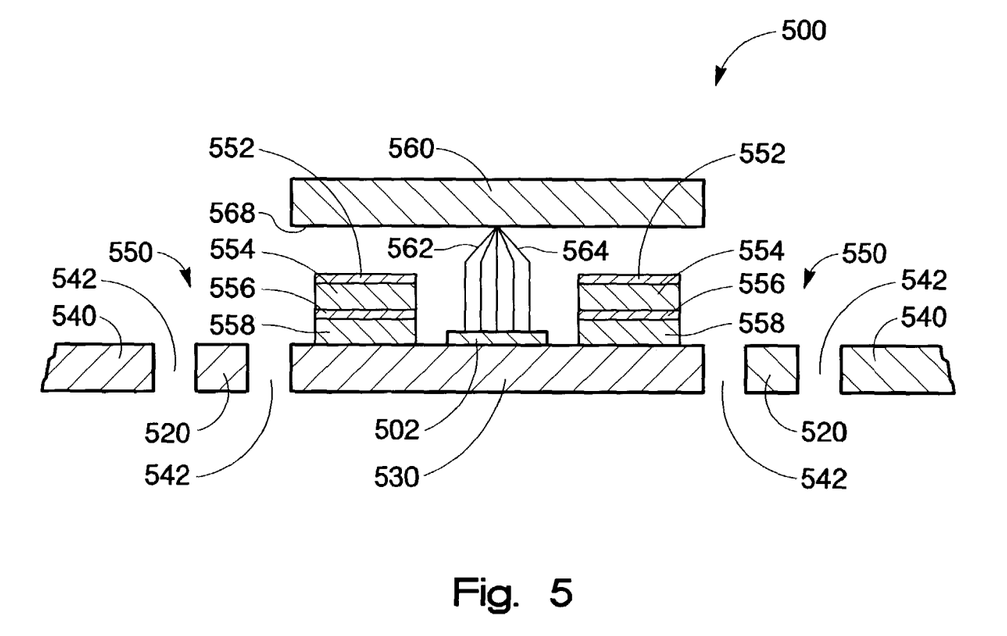
FIG. 5 is a cross-sectional view of a micro-fabricated device having an integrated vacuum device according to an alternate embodiment of the present invention.

FIG. 5 is an exemplary embodiment of a micro-fabricated device having integrated vacuum device 502 that includes anode surface 568 such as a display screen or a mass storage device that is affected by electrons 562 when they are formed into a focused beam 564. Thermally insulating structure 520 includes thermoelectric device 550 that provides heating or cooling of device substrate 530 depending on the particular performance parameters desired to be optimized. In addition, thermally insulating structure 520 also reduces the thermal conduction between device substrate 530 and support structure 540 while providing mechanical support. Device substrate 530 is disposed, within aperture 542 formed in support structure 540. Anode surface 568 is held at a predetermined distance from second electron lens element 552. Micro-fabricated device 500 is enclosed in a vacuum package (not shown).

In this embodiment, integrated vacuum device 502 is shown in a simplified block form and may be any of the electron emitter structures well known in the art such as a Spindt tip or flat emitter structure. Second lens element 552 acts as a ground shield. Vacuum device 502 is disposed over at least a portion of device substrate 530. First insulating or dielectric layer 554 electrically isolates second lens element 552 from first lens element 556. Second insulating layer 558 electrically isolates first lens element 556 from vacuum device 502 and substrate 530. In alternate embodiments, more than two lens elements, may also be utilized to provide, for example, an increased intensity of emitted electrons 562, or an increased focusing of electron beam 564, or both. Utilizing conventional semiconductor processing equipment both the lens elements and dielectrics may be fabricated.

As a display screen, an array of pixels (not shown) are formed on anode surface 568, which are typically arranged in a red, blue, green order, however, the array of pixels may also be a monochromatic color. An array of emitters (not shown) are formed on device substrate 530 where each element of the emitter array has one or more integrated vacuum devices acting as an electron emitter. Application of the appropriate signals to an electron lens structure including first and second electron lens elements 552 and 556 generates the necessary field gradient to focus electrons 562 emitted from vacuum device 502 and generate focused beam 564 on anode surface 568.

As a mass storage device, anode surface 568 typically includes a phase-change material or storage medium that is affected by the energy of focused beam 564. The phase-change material generally is able to change from a crystalline to an amorphous state (not shown) by using a high power level of focused beam 564 and rapidly decreasing the power level of focused beam 564. The phase-change material is able to change from an amorphous state to a crystalline state (not shown) by using a high power level of focused beam 564 and slowly decreasing the power level so that the media surface has time to anneal to the crystalline state. This change in phase is utilized to form a storage area on anode surface 568 that may be in one of a plurality of states depending on the power level used of focused beam 564. These different states represent information stored in that storage area.

An exemplary material for the phase change media is germanium telluride (GeTe) and ternary alloys based on GeTe. The mass storage device also contains electronic circuitry (not shown) to move anode surface 568 in a first and preferably second direction relative to focused beam 564 to allow a single integrated vacuum device 502 to read and write multiple locations on anode surface 568. To read the data stored on anode or media surface 568, a lower-energy focused beam 564 strikes media surface 568 that causes electrons to flow through the media substrate 560 and a reader circuit (not shown) detects them. The amount of current detected is dependent on the state, amorphous or crystalline, of the media surface struck by focused beam 564.

Figure 6:
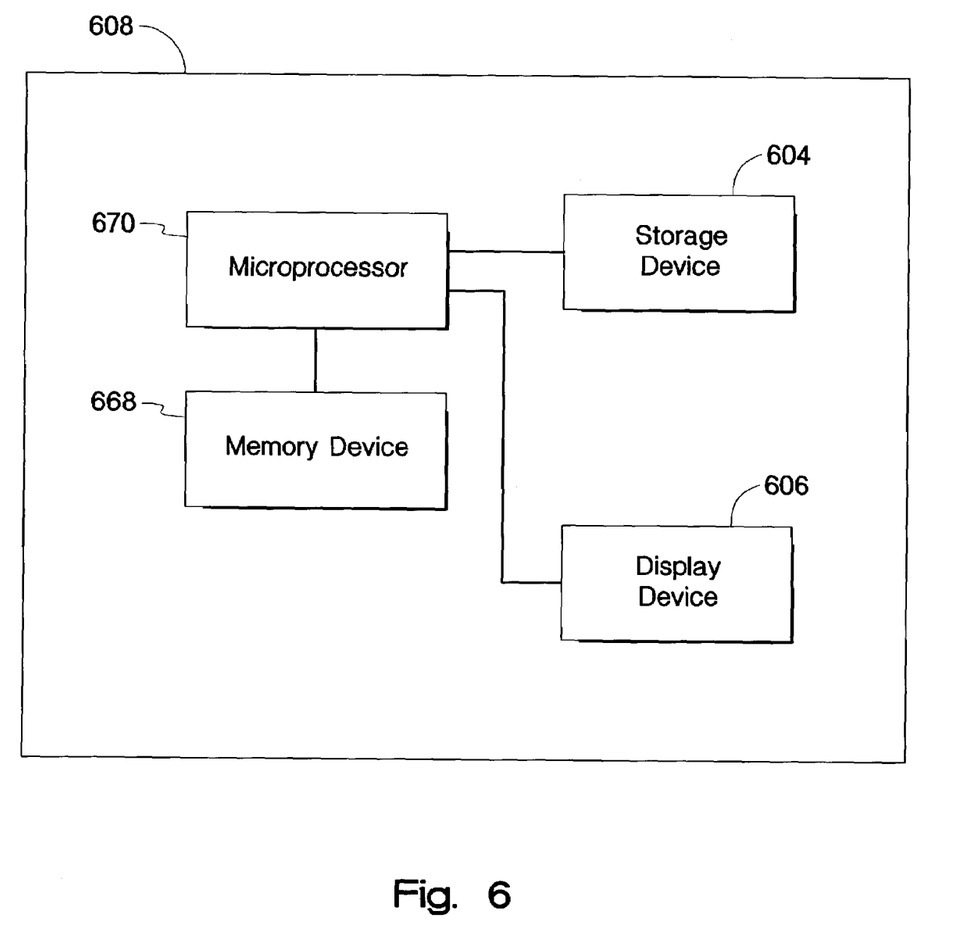
FIG. 6 is a block diagram of an electronic device according to an embodiment of the present invention.

Referring to FIG. 6 an exemplary block diagram of an electronic device 608, such as a computer system, video game, Internet appliance, terminal, MP3 player, cellular phone, or personal digital assistant to name just a few. Electronic device 608 includes microprocessor 670, such as an Intel processor sold under the name "Pentium Processor," or compatible processor. Many other processors exist and may also be utilized. Microprocessor 670 is electrically coupled to a memory device 668 that includes processor readable memory that is capable of holding computer executable commands or instructions used by the microprocessor 670 to control data, input/output functions, or both. Memory device 668 may also store data that is manipulated by microprocessor 670. Microprocessor 670 is also electrically coupled either to storage device 604, or display device 606 or both. Microprocessor 670, memory device 668, storage device 604, and display device 606 each may contain an embodiment of the present invention as exemplified in earlier described figures and text showing device substrates having thermally isolating structures.

Figure 7:
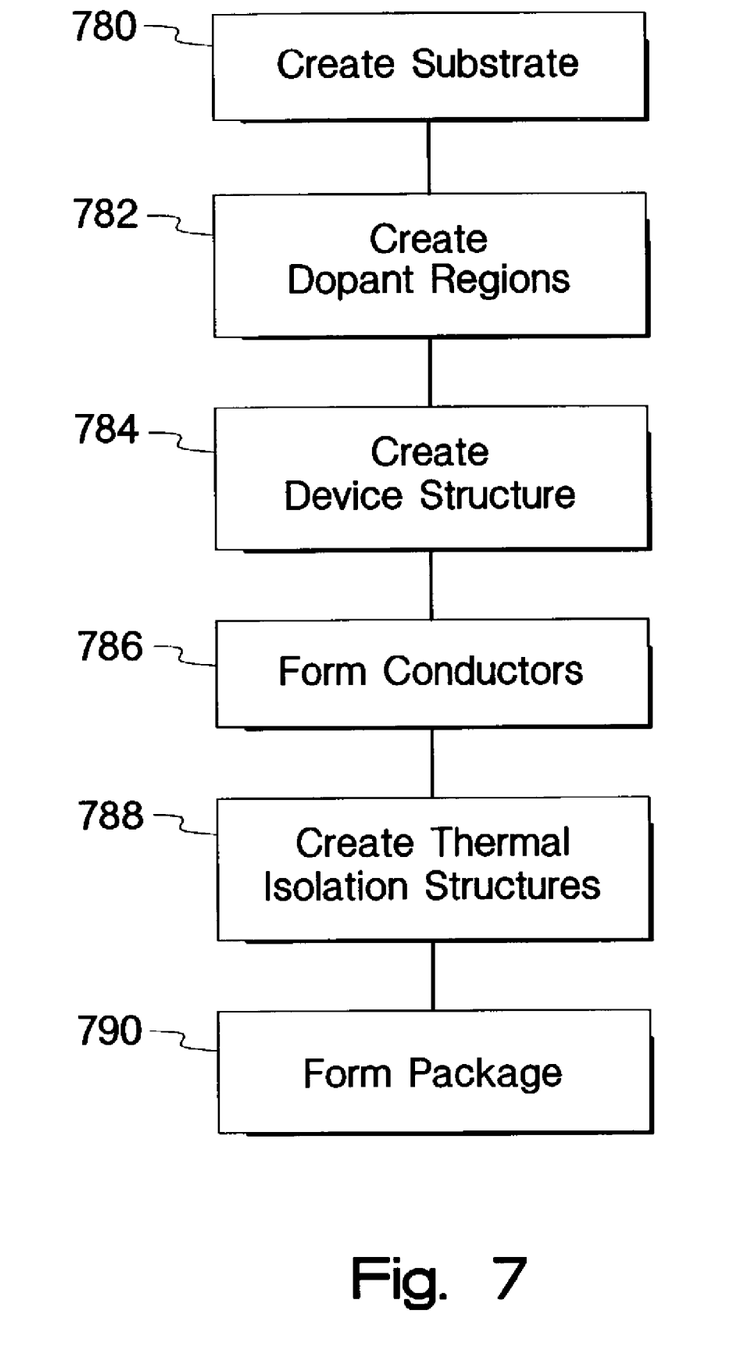
FIG. 7 is a flow chart of a method of making a micro-fabricated device according to an embodiment of the present invention.

Referring to FIG. 7 a flow diagram of a method of manufacturing a micro-fabricated device, according to an embodiment of the present invention, is shown. Substrate creating process 780 is utilized to create or form the substrate in which the device substrate and support structure may be created. The substrate is a single crystal intrinsic silicon wafer having a thickness of about 200–800 microns. However, in alternate embodiments, both other materials and thicknesses may be utilized. For example, silicon on insulator, lightly n or p doped silicon wafers, gallium arsenide, and indium phosphide are just a few of other semiconductor wafer technologies that may also be utilized. Further, in still other embodiments, glass, ceramic, and polymer substrates are just a few of the alternate materials that may also be used in the present invention. Thus, substrate creating process 780 is not restricted to typical wafer sizes, and may include processing a polymer sheet or film or glass sheet or even a single crystal sheet or substrate handled in a different form and size than that of conventional silicon wafers.

Dopant region creation process 782 is utilized to create the n-doped and p-doped regions utilized to form the thermal transfer segments of the thermoelectric device formed on the thermally isolating structure of the present invention. In addition dopant region creation process 782 may also be utilized to create n-doped and p-doped regions for other active electronic devices described earlier, and will depend on the particular devices utilized as well as the particular application in which the micro-fabricated device will be utilized. The doped regions are generally formed sequentially. A silicon oxide or nitride or other suitable material is deposited over the substrate and patterned to form a mask having openings of the desired shape of the doped region. The particular dopant is then generally implanted, to the desired dose, into the open region of the mask utilizing conventional ion implantation equipment; however, other implantation processes may also be utilized. An annealing step generally follows the dopant implantation process. The particular annealing process is ion-dose and ion-species-dependent. The mask is then removed generally by chemical etching, however, any suitable etching process or layer removable process may be utilized. The process is then repeated for the complementary dopant to form the n-doped and p-doped regions.

Device structure creation process 784 is utilized to create MEMS structures or active devices or combinations of both on the micro-fabricated device. Depending on the particular application in which micro-fabricated device will be utilized any MEMS structure may be created, for example, MEMS structures may include transducers, actuators, sensors, and valves to name a few. In addition, device structure creation process 784 also includes creating various electronic circuits such as, for example, transistors, logic circuits, memory cells, as well as, passive devices such as capacitors, resistors, and inductors. For clarity these devices are represented as a single layer in the various embodiments shown. The particular devices and circuits created will depend on the particular application in which the micro-fabricated device will be utilized. Typically, the electronic circuits are fabricated utilizing conventional IC processing equipment and processes generally involving deposition, patterning, and etching processes. Bulk or surface micromachining or combinations of both may also be utilized to form the MEMS structures. For example, an integrated pressure sensor is typically fabricated using IC processing to create the driving and analysis circuits followed by micromachining from the backside of the wafer to create a micromachined diaphragm. Other examples, include infrared sensing arrays formed utilizing IC processing to form thermopiles and other circuitry followed by micromachining to create the sensing array, or fabricating an amplifier operating in the radio frequency range utilizing CMOS technology to fabricate the IC amplifier and micromachining to produce an inductor with the proper resonance frequency. In an alternate embodiment, device structure creation process 784 may also utilize LIGA (a German acronym lithographe, galvanoformung, abformung), a technique for fabrication of three-dimensional structures with high aspect ratios involving lithography, electroforming, and micromolding. Device structure creation process 784 also includes deposition and pattern generation for electrical traces and interconnect pads providing for the routing of signals and power to various portions of the micro-fabricated device.

Conductor creation process 786 is utilized to form the coupling conductors, segment conductor, and power conductors for the thermoelectric device. The conductors are electrically conductive and may be metal or alloy thin films; however, any electrical conductor having the desired current carrying capacity may be utilized. Various deposition techniques such as sputter deposition, chemical vapor deposition, evaporation, electrodeposition, or other vapor deposition technique may be utilized to create the conductors. The particular deposition technique utilized will depend on the particular material chosen for the electrical conductors. Examples of typical metals that may be utilized are aluminum, gold, tungsten, copper, tantalum, and platinum to name a few. Photolithography and associated etches processes are used to generate the desired pattern of the coupling, segment, and power conductors.

Thermally isolating structure creation process 788 is utilized to create the thermally isolating structures. A dielectric passivation layer is deposited over the silicon substrate, MEMS and electronic devices. The dielectric layer may be deposited utilizing deposition techniques such as plasma enhanced chemical vapor deposition (PECVD), atmospheric or low pressure chemical vapor deposition, sputter deposition, or other suitable deposition technique may be utilized to deposit refractory dielectrics such as silicon oxide, silicon nitride, or silicon carbide to name just a few examples. In alternate embodiments, spin coating, curtain coating, or screen printing may also be utilized to form a polymer dielectric passivation layer such as polyimides, or benzocyclobutene as just a couple of examples. After deposition various planarizing processes such as chemical mechanical processing (CMP) may be utilized for those applications desiring a planarized dielectric layer. An etch defining layer is deposited on the back or opposite side of the silicon substrate. Generally the etch defining layer is a silicon nitride or oxide layer, however, in alternate embodiments, other refractory materials such as silicon carbide or an oxynitride film may also be used. In still other embodiments polymeric materials such as a photo resist or polyimide may also be utilized depending on various parameters such as the particular substrate material utilized as well as the particular etchant utilized to form the thermally isolating structures. The etch defining layer is then patterned in the desired shape to form the thermally isolating structures, the device substrate, and the support structure utilizing conventional photolithographic technologies and processes leaving those areas, such as the aperture or gap between the device substrate and support structure, to be etched opened. The size and shape of these openings also depends on various parameters such as particular etchant utilized as well as the substrate material. For example, an anisotropic wet etch such as potassium hyrdoxide (KOH) or tetra methyl ammonium hydroxide (TMAH), may be utilized to etch a (100) oriented silicon wafer, and produce various structures with sloped side walls generated by the slower etch rate of the (111) crystallographic planes. Alternatively a dry etch may be used when vertical or orthogonal sidewalls are desired. In addition, combinations of wet and dry etch may also be utilized when more complex structures are desired. Further, other processes such as laser ablation, reactive ion etching, ion milling including focused ion beam patterning may also be utilized to form the thermally isolating structures, the device substrate, and the support structure. After the thermally isolating structures are formed the dielectric passivation layer and the etch defining layer may be completely removed or left in selective areas, depending on various parameters such as the desired thermal and electrical isolation properties of various portions of the micro-fabricated device as well as the particular type of package utilized.

Package forming process 790 is utilized to enclose the micro-fabricated device providing protection from physical damage, as well as, contamination and environmental degradation. The particular package utilized will depend on various parameters such as cost, device performance, and reliability. For example, for those microfabricated devices utilizing a vacuum package package bond structures may be formed on the support structure over the dielectric passivation layer and the etch defining layer, which provide electrical isolation. The package bond structures, for example, may be a gold-silicon eutectic for bonding a silicon die to a ceramic package or metal can or the bond structures may be a softer lower melting point solder to illustrate a couple of examples of materials that may be utilized.

Generally the package consists of a lid or a cover and a base. Bond structures are also formed on the lid and base. The material utilized for the package bond structures, as well as, the lid and base bond structures will depend on the particular materials utilized for the device substrate, support structure and the base and lid. The base and lid may be formed from various, ceramic, glass, or metal materials. The particular material will depend on, for example, the desired pressure to be maintained; the temperature and humidity and other environmental factors to which the micro-fabricated device will be exposed; and the amount of stress that may be imparted to the micro-fabricated device as a result of the packaging process; as well as, the particular sealing technology to be utilized. These same parameters are also considered when determining what material to be utilized as bond structures. The seal can be made by a variety of techniques including thermal compression, brazing, anodic bonding, as well as other techniques.

What is claimed is:

1. A micro-fabricated device, comprising:
   a support structure including an aperture formed therein;
   a device substrate disposed within said aperture;
   a thermally isolating structure coupling said device substrate to said support structure; and a thermoelectric device disposed at a first major surface of said thermally isolating structure, said thermoelectric device having:
  at least one n-doped region disposed on or in said thermally isolating structure,
  at least one p-doped region disposed on or in said thermally isolating structure, and
  an electrical interconnect connecting said at least one n-doped region and
said at least one p-doped region,
wherein said support structure, said device substrate, and said thermally isolating structure form a unitary structure.

2. The micro-fabricated device in accordance with claim 1, wherein said device substrate is disposed a distance G from said support structure, and said thermally isolating structure further comprises a characteristic length, wherein said characteristic length is greater than said distance G.

3. The micro-fabricated device in accordance with claim 2, wherein said characteristic length is the thermal conduction path length thermal energy travels between said device substrate and said support surface.

4. The micro-fabricated device in accordance with claim 1, wherein said at least one n-doped region and said at least one p-doped region, further comprise a plurality of n and p-doped regions electrically coupled in an alternating series.

5. The micro-fabricated device in accordance with claim 1, wherein said at least one n-doped region and said at least one p-doped region, further comprises at least one thermoelectric segment.

6. The micro-fabricated device in accordance with claim 5, wherein said device substrate further comprises a peripheral edge, and said support structure further comprises an inner edge, and wherein said at least one thermoelectric segment further comprises a plurality of thermoelectric segments having a number of thermoelectric segments, said plurality of thermoelectric segments arranged at said first major surface of said thermally isolating structure, wherein said number of thermoelectric segments increases in the direction from said peripheral edge to said inner edge.

7. The micro-fabricated device in accordance with claim 1, wherein said thermally isolating structure further comprises a folded structure having at least one fold.

8. The micro-fabricated device in accordance with claim 7, wherein said folded structure further comprises a first section, a second section, and a folding section, wherein said second section is folded back and substantially parallel to said first section, whereby a U shaped structure is formed.

9. The micro-fabricated device in accordance with claim 1, wherein said device substrate and said thermally isolating structure are formed utilizing a material selected from the group consisting of silicon, gallium arsenide, germanium, indium phosphide, sapphire, glass, ceramic, polymers, and combinations thereof.

10. The micro-fabricated device in accordance with claim 1, wherein said thermally isolating structure further comprises a thickness less than the thickness of said device structure.

11. The micro-fabricated device in accordance with claim 1, wherein said device substrate further comprises a peripheral edge, and said support structure further comprises an inner edge, and wherein said thermally isolating structure, further comprises a cross-sectional area that varies in the direction from said peripheral edge to said inner edge.

12. The micro-fabricated device in accordance with claim 1, wherein said thermally isolating structure further comprises a structure projecting in a radial direction from a peripheral edge of said device substrate.

13. The micro-fabricated device in accordance with claim 1, further comprising at least one active device disposed on said device substrate.

14. The micro-fabricated device in accordance with claim 13, wherein said at least one active device further comprises at least one transistor.

15. The micro-fabricated device in accordance with claim 1, further comprising a vacuum device disposed on said device substrate.

16. The micro-fabricated device in accordance with claim 15, wherein said vacuum device further comprises an electron emitter.

17. A storage device, comprising:
  at least one micro-fabricated device of claim 16; and
  a storage medium in close proximity to said at least one electronic device, said storage medium having a storage area in one of a plurality of states to represent information stored in that storage area.

18. A computer system, comprising:
  a microprocessor;
  an electronic device including at least one micro-fabricated device of claim 1 coupled to said microprocessor; and
  memory coupled to said microprocessor, said microprocessor operable of executing instructions from said memory to transfer data between said memory and the electronic device.

19. The computer system in accordance with claim 18, wherein said electronic device is a storage device.

20. The computer system in accordance with claim 18, wherein said electronic device is a display device.

21. The computer system in accordance with claim 18, wherein said microprocessor further comprises a micro-fabricated device having:
  a support structure including an aperture formed therein;
  a device substrate disposed within said aperture;
  a thermally isolating structure coupling said device substrate to said support structure; and
  a thermoelectric device disposed at a first major surface of said thermally isolating structure, said thermoelectric device having:
    at least one n-doped region disposed on or in said thermally isolating structure,
    at least one p-doped region disposed on or in said thermally isolating structure and non-contiguous with said at least one n-doped region, and
    an electrical interconnect connecting said at least one n-doped region and said at least one p-doped region.

22. The micro-fabricated device in accordance with claim 1, wherein said thermally isolating structure further comprises a second major surface, wherein said first and second major surfaces include:
  at least one n-doped region disposed at each of said first and second major surfaces,
  at least one p-doped region disposed at each of said first and second major surfaces, and
  an electrical interconnect coupling said at least one n-doped region and said at least one p-doped region on each of said first and second major surfaces.

23. The micro-fabricated device in accordance with claim 1, wherein said at least one n-doped region or said at least one p-doped region includes a high Seebeck coefficient material.

24. The micro-fabricated device in accordance with claim 1, wherein said thermally isolating structure hinders thermal conduction between said device substrate and said support structure.

25. The micro-fabricated device in accordance with claim 1, wherein said thermoelectric device further comprises an integrated thermoelectric device formed at said first major surface of said thermally isolating structure.

26. The micro-fabricated device in accordance with claim 1, wherein said at least one n-doped region is non-contiguous with said at least one p-doped region, whereby an integrated thermoelectric device is formed.

27. A thermally isolated micro-fabricated device, comprising:
- a device substrate disposed within an aperture formed in a suppport structure;
- means for hindering thermal conduction disposed between said device substrate and said support structure; and
- means for thermoelectrically heating and/or cooling said device substrate, said means for thermoelectrically heating and/or cooling disposed at a surface of said means for hindering thermal conduction, wherein said support structure, said device substrate, and said means for hindering thermal conduction form a unitary structure.

28. A micro-fabricated device, comprising
- a support structure including an aperture formed therein;
- a device substrate disposed a distance G from said support structure within said aperture;
- a thermally isolating structure disposed between said device substrate and said support structure, said thermally isolating structure includes a characteristic length, wherein said characteristic length is greater than said distance G; and
- a thermoelectric device disposed at a surface of said thermally isolating structure said thermoelectric device having:
  - at least one n-doped region formed on or in said thermally isolating structure,
  - at least one p-doped region formed on or in said thermally isolating structure and non-contiguous with said at least one n-doped region, wherein said support structure, said device substrate, and said thermally isolating structure form a unitary structure.

29. A micro-fabricated device, comprising
- a support structure including an aperture formed therein;
- a device substrate disposed in said aperture;
- a connecting structure coupling said device substrate to said support structure, said connecting structure hindering thermal conduction between said device substrate and said support structure; and
- a thermoelectric device disposed at a surface of said connecting structure, wherein said support structure, said device substrate, and said connecting structure form a unitary structure.

* * * * *

UNITED STATES PATENT AND TRADEMARK OFFICE
CERTIFICATE OF CORRECTION

| | |
|---|---|
| PATENT NO. | : 7,205,675 B2 |
| APPLICATION NO. | : 10/353632 |
| DATED | : April 17, 2007 |
| INVENTOR(S) | : James C. McKinnell et al. |

It is certified that error appears in the above-identified patent and that said Letters Patent is hereby corrected as shown below:

On sheet 4 of 8, in Fig. 3a, above tag "368", delete "358" and insert -- 358' --, therefor.

In column 11, line 24, in Claim 4, after "region" delete ",".

In column 11, line 28, in Claim 5, after "region" delete ",".

In column 13, line 12, in Claim 27, delete "suppport" and insert -- support --, therefor.

Signed and Sealed this

Seventeenth Day of March, 2009

JOHN DOLL
*Acting Director of the United States Patent and Trademark Office*